United States Patent
Autry

(10) Patent No.: US 8,018,042 B2
(45) Date of Patent: Sep. 13, 2011

(54) INTEGRATED CIRCUIT WITH FLEXIBLE PLANAR LEADS

(75) Inventor: Tracy Autry, Trabuco Canyon, CA (US)

(73) Assignee: Microsemi Corporation, Irvine, CA (US)

( * ) Notice: Subject to any disclaimer, the term of this patent is extended or adjusted under 35 U.S.C. 154(b) by 189 days.

(21) Appl. No.: 12/315,741

(22) Filed: Dec. 5, 2008

(65) Prior Publication Data

US 2009/0134508 A1    May 28, 2009

Related U.S. Application Data

(63) Continuation-in-part of application No. 11/728,624, filed on Mar. 27, 2007.

(60) Provisional application No. 60/919,794, filed on Mar. 23, 2007.

(51) Int. Cl.
*H01L 23/48* (2006.01)

(52) U.S. Cl. ........ 257/688; 257/669; 257/692; 257/693; 257/E23.01; 257/E23.04; 174/525; 361/718

(58) Field of Classification Search ............. 257/688, 257/E23.01, E23.023, E23.031, E23.034, 257/E23.055, 528, 669, 692, 693, 700, 734, 257/735, 784; 174/525, 527, 533, 544, 554; 361/717, 718

See application file for complete search history.

(56) References Cited

U.S. PATENT DOCUMENTS

| 3,536,964 | A | * | 10/1970 | Nixdorf et al. | 257/790 |
|3,999,280|A|*|12/1976|Hansen et al.|438/26|
|5,001,545|A|*|3/1991|Kalfus et al.|257/773|
|5,045,921|A| |9/1991|Lin et al.| |
|5,528,079|A|*|6/1996|McIver|257/698|
|6,054,759|A| |4/2000|Nakamura| |
|6,316,832|B1|*|11/2001|Tsuzuki et al.|257/747|
|6,486,544|B1| |11/2002|Hashimoto| |
|6,876,069|B2| |4/2005|Punzaalan et al.| |
|6,909,176|B1| |6/2005|Wang et al.| |
|7,217,997|B2| |5/2007|Wyland| |
|7,462,933|B2| |12/2008|Zhao et al.| |
|7,586,758|B2| |9/2009|Cady et al.| |
|2005/0037258|A1| |2/2005|Itoh et al.| |

FOREIGN PATENT DOCUMENTS

| DE | 2 253 627 | 5/1974 |
| EP | 0 512 742 A1 | 11/1992 |
| WO | WO 89/10005 | 10/1989 |

* cited by examiner

*Primary Examiner* — Tom Thomas
*Assistant Examiner* — Eduardo A Rodela
(74) *Attorney, Agent, or Firm* — Robert C. Klinger

(57) ABSTRACT

A microelectronic device including a microelectronic circuit and at least one planar flexible lead. These planar flexible leads are adapted to bend and flex during mechanical stress, allowing direct mounting of the device to a member and able withstand extreme thermal cycling between −20° C. to +80° C. encountered in terrestrial applications. Advantageously, the microelectronic device is adapted to be both weldable and solderable. The invention may comprise a solar cell diode, which is flexible and so thin that it can be affixed directly to the solar panel proximate the solar cell.

10 Claims, 4 Drawing Sheets

INTEGRATED CIRCUIT WITH FLEXIBLE PLANAR LEADS

PRIORITY CLAIM

This application is a Continuation-in-Part of U.S. patent application Ser. No. 11/728,624, entitled "Integrated Circuit with Flexible Planar Leads" filed Mar. 27, 2007, which claims priority of U.S. Provisional Ser. No. 60/919,794, entitled "Integrated Circuit with Flexible Planar Leads" filed Mar. 23, 2007.

FIELD OF THE INVENTION

The present invention is generally directed to integrated circuits, and more particularly to integrated circuit packages including diodes that are adapted to withstand extreme thermal cycling, such as that incurred space or desert environments, such as in solar panels.

BACKGROUND OF THE INVENTION

As the popularity of solar panels continues to grow, expensive failures have been occurring at an ever increasing rate due to the prolonged effects of thermal expansion and the limited life cycles of solar panel components. All materials have a coefficient of thermal expansion, which is a thermal index indicating the relative degree a material expands or contracts as a function of temperature. Materials contract as they are cooled, and expand as they are warmed. Therefore, microelectronic devices employ materials with similar coefficients of thermal expansion that they can withstand extreme thermal cycling. In both space and terrestrial applications, an integrated circuit includes a solar cell diode which may be joined to a solar cell panel. These solar cell devices are comprised of a semiconductor material and are soldered to the solar panel, and interconnected to other circuits using rigid materials, such as rigid axial leads. These rigid axial leads can tolerate extreme thermal cycling for a period of time, but have a limited life cycle, and were designed for solder attachment to the solar panel. The solder joint in this design has limited thermal cycling capability due to thermal expansion mismatch, solder re-crystallization, and solder creep. Cracking in the solder joint is then followed by an electrical disconnect with the circuit. There is desired an improved microelectronic device adapted to withstand extreme thermal cycling, such as that encountered in a space or desert environment.

SUMMARY OF INVENTION

The present invention achieves technical advantages as a microelectronic device including a microelectronic circuit and a planar flexible lead. The planar flexible lead is adapted to bend and flex during mechanical stress and during extreme temperature cycling, and allow direct mounting of the device to a member by easily welding or soldering. The invention may comprise a flexible solar cell diode that can be closely positioned on solar panels at an extremely low cost.

DETAILED DESCRIPTION OF THE PRESENT INVENTION

Figure 1:
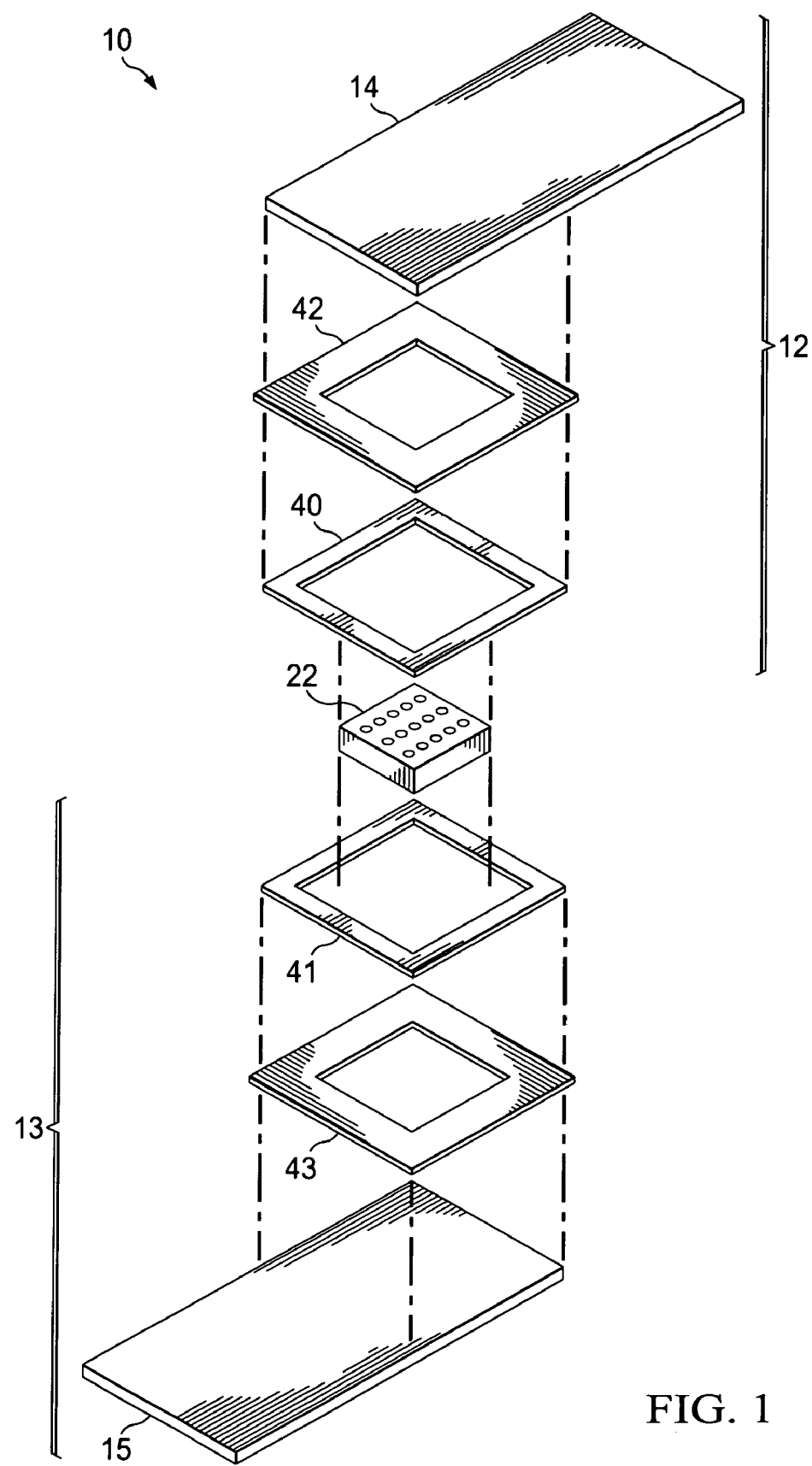
FIG. 1 is an exploded perspective view of a microelectronic package having a planar flexible lead according to one embodiment of the invention.

The numerous innovative teachings and aspects of the present invention will be described with particular reference to the following exemplary embodiments. However, it should be understood that this class of embodiments provides only a few examples of the many advantageous uses and innovative teachings of the inventor. In general, statements made in the specification of the present application do not necessarily delimit any of the various claimed inventions. Moreover, some statements may apply to some inventive features, but not to others.

Microelectronic devices are typically comprised of an integrated circuit diode die encompassed in a package having a plurality of external leads permitting electrical attachment to a printed circuit board. These microelectronic devices are available as commercial devices, and some are available as high reliability devices such as used in military applications, including those integrated in space environments, such as satellites, space vehicles and solar panels. In space environments, microelectronic devices need to withstand extreme thermal cycling, such as from −197° C. to +150° C. However, in extreme terrestrial environments, such as desert environments which are optimally suited for solar panel installation, microelectronic devices only need to withstand extreme thermal cycling from −20° C. to +80° C. While desert environments can see extreme temperature fluctuations every 24 hours, the expensive components required to withstand thermal cycling ranges in space are not needed for terrestrial applications. A lower cost microelectronic device for terrestrial applications that can be mass produced is desired.

All materials have a coefficient of thermal expansion, which is a thermal index indicating the relative degree a material expands or contracts as a function of temperature. Materials contract as they are cooled, and expand as they are warmed. Therefore, microelectronic devices employ materials with similar coefficients of thermal expansion that they can withstand extreme thermal cycling. Portions of the device having similar coefficients of thermal expansion are secured to one another using adhesive, paste, solder and so forth to avoid separation during thermal cycling.

In terrestrial applications, one typical integrated circuit includes a solar cell by-pass diode which may be joined to a solar cell panel. These terrestrial solar cell diodes are also subject to severe thermal cycling environments given their exposure to the sun and subsequent shading therefrom numerous times over their life cycle. Conventionally, these solar cell devices are comprised of semiconductors and are soldered or welded to the solar panel, and interconnected to other circuits using rigid materials, such as rigid axial leads. These rigid leads can tolerate the extreme thermal cycling for a period of time, but have a limited life cycle. These axial leaded devices were designed for solder attachment to the solar panel. The solder joint in this design has limited thermal cycling capability due to thermal expansion mismatch, solder re-crystallization, and solder creep. Cracking it the solder joint is then followed by an electrical disconnect with the circuit.

More recently, solar panel manufacturers have switched to attaching the axial leaded devices using a welded connection. The axial leads do not lend themselves to welding easily. Solar panel manufactures struggle with the weld attachment. Welding flat leads to round axial leads causes reliability and weld consistency problems. An easier more reliable method is desired.

Integrated circuits generate heat during operation due to conduction losses. This heat must be dissipated from the device for proper functioning. Axial leaded diodes in particular are very difficult to heat sink to the panel and remove the heat efficiently. Solar panel manufactures have been struggling with thermal problems associated with the axial leaded diodes. A device that can be more efficiently heat sunk is desired.

Figure 3:
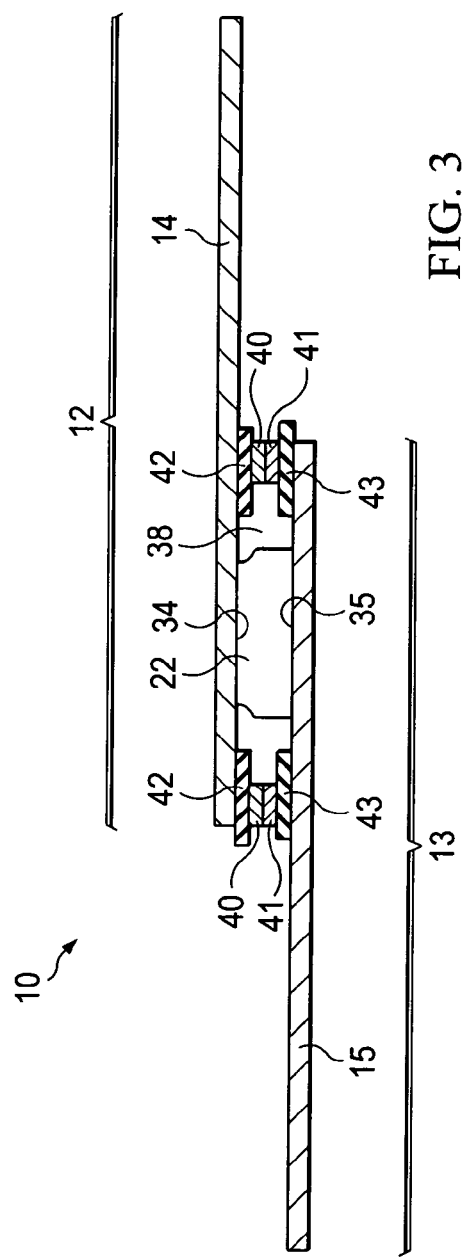
FIG. 3 is a cross sectional view of the microelectronic package taken along line 3-3 in FIG. 2.

Referring to FIG. 1, there is generally shown at 10 a microelectronic device seen to include an integrated circuit interposed between a pair of planar flexible leads 14 and 15 in accordance with one aspect of the present invention. The integrated circuit is seen to comprise a microelectronic circuit 22, such as a die, secured upon the flex leads 14 and 15, as shown. Polyimide isolation rings 42 and 43 and copper seal area rings 40 and 41 provide a pseudo-hermetic seal around die 22 between upper planar flexible lead 14 and lower planar flexible lead 15. In one preferred embodiment, a polyimide isolation ring 42 is affixed proximate one end of a planar flexible lead 14 with a copper seal area ring 40 affixed atop the polyimide isolation ring 42 forming half a die attach cavity 38 as seen in FIG. 3. Planar flexible lead 14 (15), polyimide isolation ring 42 (43), and copper seal area ring 40 (41) are typically sold as one assembly 12 (13), two of which and a die 22 are required to form the microelectronic device 10. The upper assembly 12, although structurally identical to lower assembly 13, is inverted and rotated 180° from lower assembly 13 such that the ends of planar flexible leads 14 and 15 point in opposite directions and copper seal area rings 40 and 41 abut to create a die attach cavity 38, as seen in FIG. 3, wherein the die 22 is secured to planar portions of planar flexible leads 14. In a second preferred embodiment, Planar construction is utilized where the top and bottom assemblies 12 and 13 are not identical.

Advantageously, the planar flexible leads 14 and 15 are each formed as a thin sheet such as they are configured to flex, particularly during mechanical stress and during extreme thermal cycling. The planar flexible leads 14 and 15 may be formed as a membrane, but may have other shapes and profiles, and have an electrically conductive portion permitting electrical signals to pass from the die 22 to another member coupled to the respective flexible leads 14 and 15. According to one embodiment of the present invention, the entire flexible leads 14 and 15 are comprised of a thin planar sheet of an electrically conductive member, such as a metal or metal alloy, such as copper, gold or silver, although other materials are possible and within the scope of the present invention. In another embodiment, the flexible lead can be comprised of an electrically conductive member formed on another material, such as a backing member. In one preferred embodiment, the thickness of the flexible leads 14 and 15 are 0.003", but may have a thickness of up to 0.03", depending on the desired electrical and thermal conductivity of the material, the desired flexibility, and compliance in its intended environment. The microelectronic device may be received in and tested in a test fixture shown.

Figure 2:
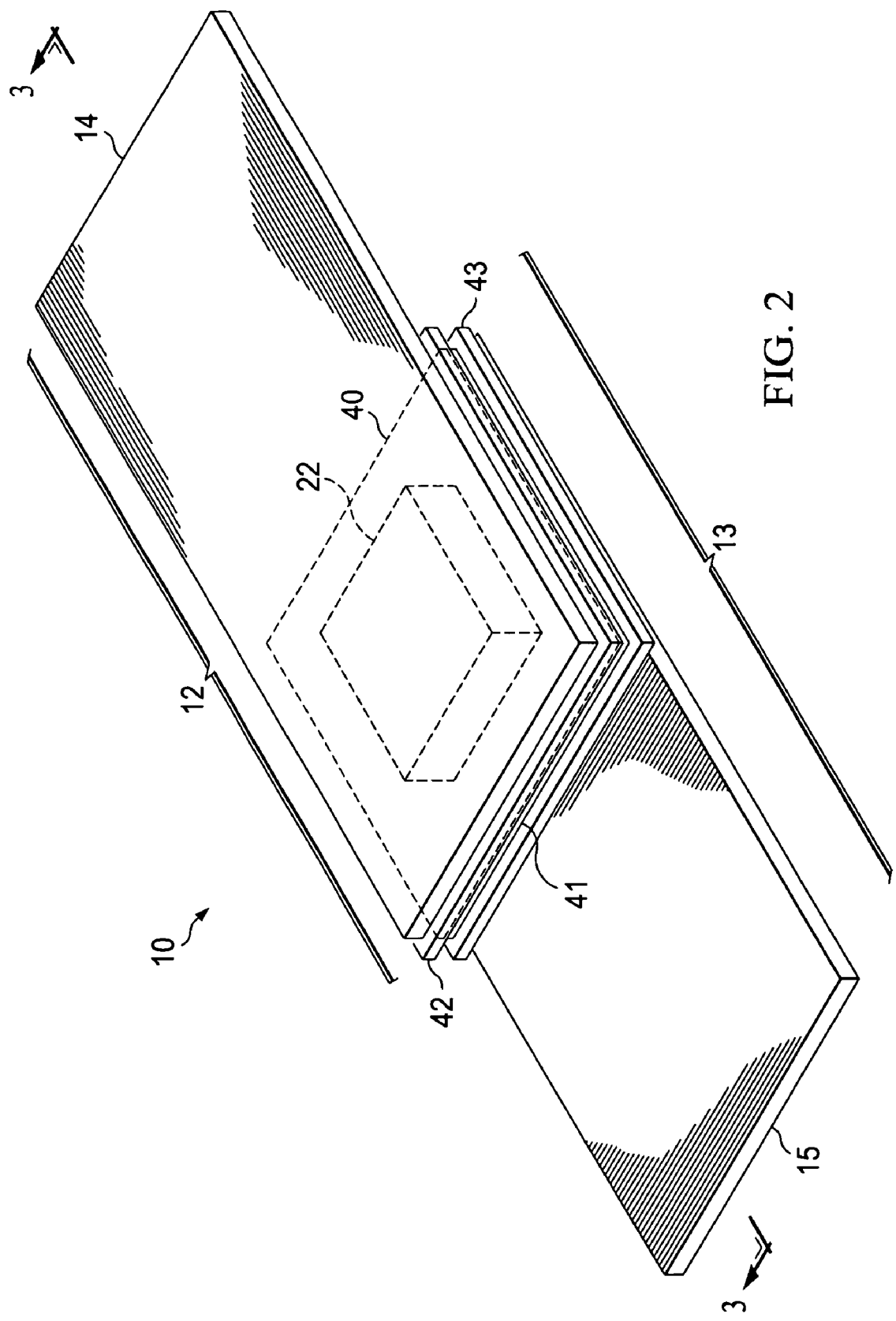
FIG. 2 is a perspective view of the microelectronic package of FIG. 1.

Referring now to FIG. 2, there is shown a perspective of the assembled microelectronic device 10 in accordance with one aspect of the present invention. Microelectronic device 10 is seen to include two assemblies 12 and 13, each consisting of one collinear planar flexible lead 14 or 15, one copper seal area ring 40 or 41, and one polyimide isolation ring 42 or 43, configured to sandwich the die 22.

Referring now to FIG. 3, there is shown a cross sectional view of the microelectronic device 10 taken along line 3-3 in FIG. 2 in accordance with one aspect of the present invention. The die 22 is seen to have a lower major surface 35 secured to a top planar surface of the lower flexible lead 15, such as by welding, soldering, brazing, electrically conductive adhesive, or other well known techniques used to join an integrated circuit base to an electrode. The die 22 is also seen to have an upper major surface 34 having secured to a bottom planar surface of the upper flexible lead 14, such as by welding, soldering, brazing, electrically conductive adhesive, or other well known techniques used to join an integrated circuit base to an electrode. Polyimide isolation rings 42 and 43 are seen to be secured about the perimeter of die 22 disposed upon the top and bottom planar surfaces of flexible leads 14 and 15 with copper seal area rings 40 and 41 disposed upon the polyimide isolation rings 42 and 43 and abutting each other to form the die attach cavity 38 about the die 22, as shown. Polyimide isolation rings 42 and 43 and copper seal area rings 40 and 41 function as a mechanical buffer between the integrated circuit chip 22 and the ends of flexible leads 14 and 15 to isolate the mechanical stress in the lead 14 and 15 from the integrated circuit chip 22. Copper seal area rings 40 and 41 are joined together, by soldering, brazing, or adhesive, to form a pseudo-hermetic seal around die 22. All the members of device 10 have very similar coefficients of thermal expansion such that the members are not overly strained or compressed with respect to one another during extreme thermal cycling.

Figure 4:
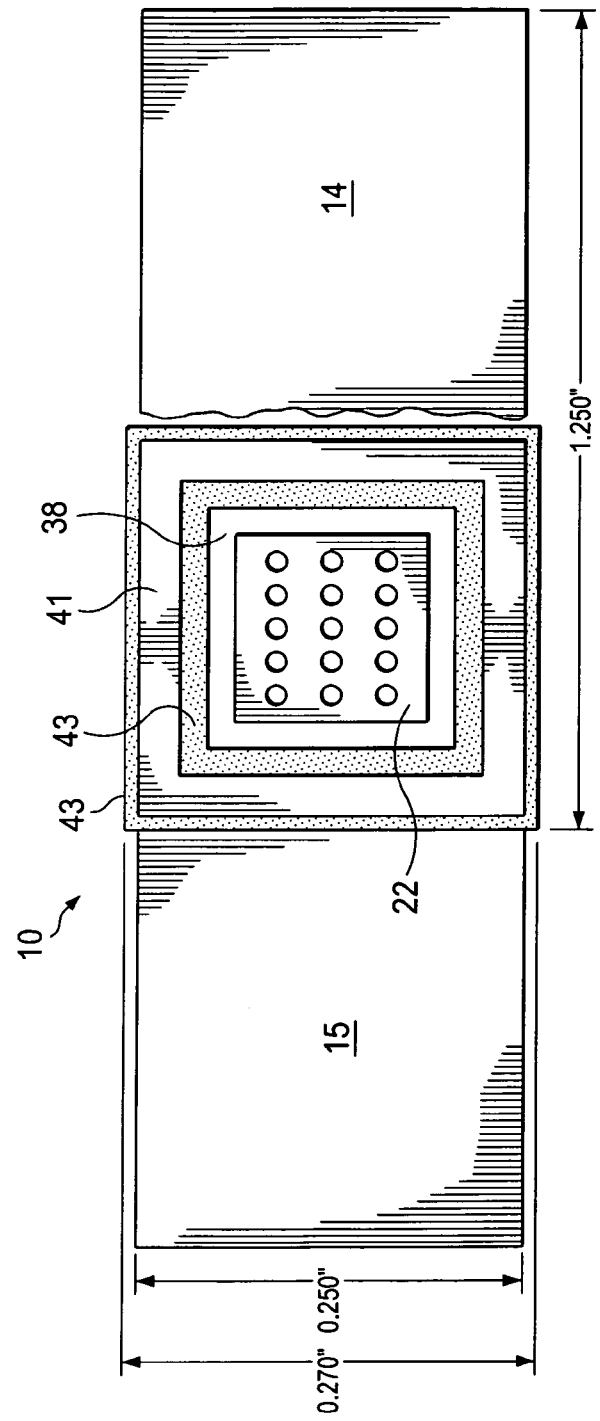
FIG. 4 is a top view of one illustrative example of the microelectronic package with the top lead cut away for better view and shown with dimensions.

Referring now to FIG. 4, there is shown a top view with the top assembly 12 cut away for a better view in accordance with one aspect of the present invention. With the top planar flexible lead 14, the upper polyimide isolation ring 42, and the upper copper seal area ring 40 cut away, it is easier to see the die 22 (shown by the dots) in the cavity 38 formed by lower polyimide isolation ring 43 (shown by the shaded ring) and the lower copper seal area ring 41 (shown by outer white ring) affixed atop the lower polyimide isolation ring 43. In the embodiment shown in FIG. 4, the planar flexible members 14 and 15 have a width of 0.250", the polyimide isolation ring 43 has a width of 0.270" and entire microelectronic device has a length of 1.250", however, limitation to this exact dimension is not to be inferred.

Figure 5:
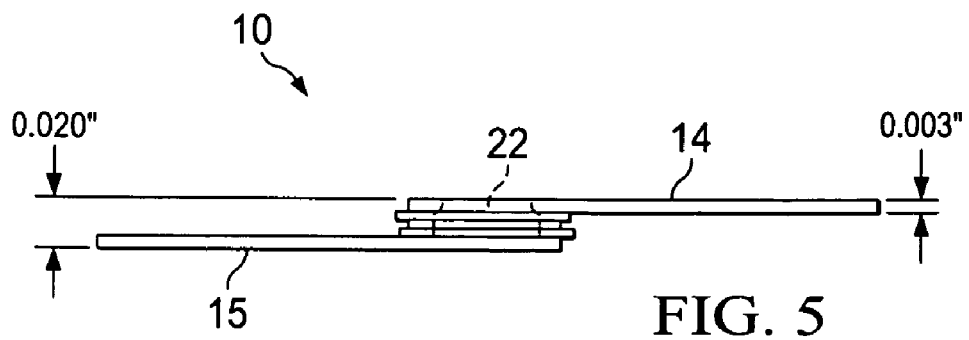
FIG. 5 is a side view of one illustrative example of the microelectronic package as shown with dimensions.

Referring now to FIG. 5, there is shown a side view of the microelectronic device in accordance with one aspect of the present invention. In the embodiment shown in FIG. 5, the die 22 may have a thickness of 0.014" and the planar flexible leads 14 and 15 may have a thickness of 0.003" each, for a total thickness of approximately 0.020", however, limitation to this exact dimension is not to be inferred.

Figure 6:
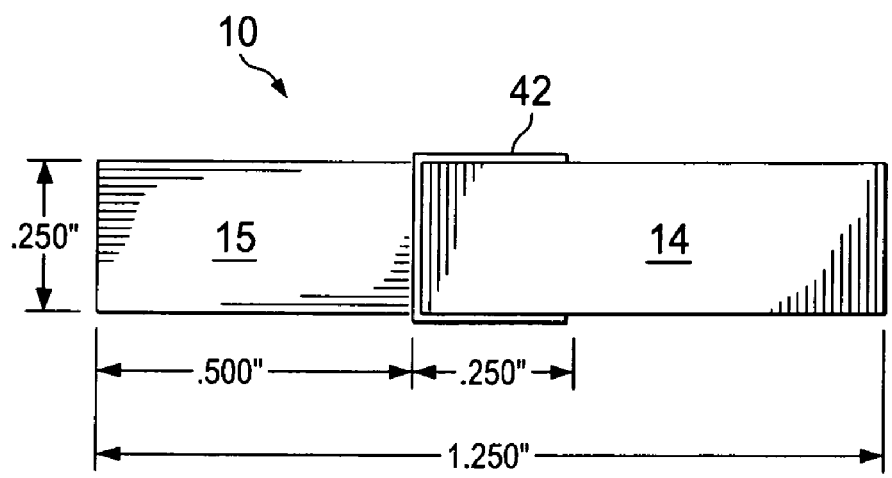
FIG. 6 is a top view of one illustrative example of the microelectronic package as shown with dimensions.
Figure 7:
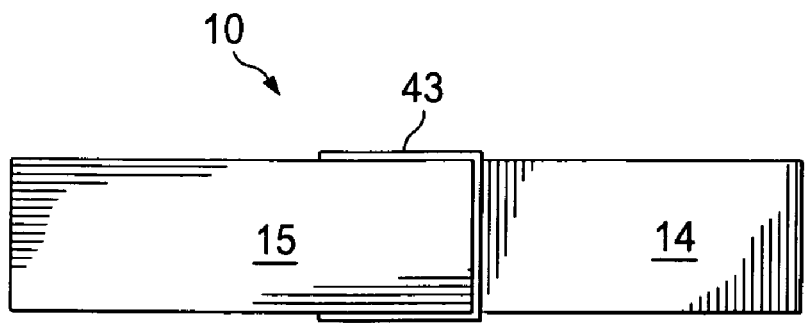
FIG. 7 is a bottom view of the illustrative example of the microelectronic package as shown in FIG. 6.

Referring now to FIGS. 6 and 7, there are shown top and bottom views of the microelectronic device in accordance with one aspect of the present invention.

One critical limitation is the thickness of the flexible leads 14 and 15. It is advantageous that the planar flexible leads 14 and 15 be comprised of a suitable material and have a suitable thickness such that it has enough mechanical strength to secure the die 22 to another member, such as directly to a solar panel, yet which is thin enough to achieve flexibility to withstand mechanical stress, such as during a solar panel application in extreme desert environments, without degradation or tearing. Therefore, it is desired that the planar flexible leads have a thickness of no greater than about 0.003", however, limitation to this exact dimension is not to be inferred.

The planar flexible leads 14 and 15 may form ribbon leads which may be bent or even twisted if necessary during attachment to a recipient member, such as a solar cell panel, or during use. The planar flexible leads achieve technical advantages over conventional rigid axial leads in that these planar leads are adapted to be weldable, which is the preferred method of attachment for devices experiencing extreme thermal cycling, such as that needed in a desert environment. Axial leads are not ideally suitable for welding.

Although one preferred embodiment of the flexible planar leads 14 and 15 is an electrically conductive material, such as a metal, alloy or other material, these leads may be comprised of more than one material, such as multilayer members comprised of same or different materials if desired. For instance, the leads may be comprised of two planar members joined along their major surfaces, or even a strip of a first material upon a planar second material. Therefore, limitation to a planar flexible lead comprised of a single material is not to be inferred.

The die 22 may comprise of a solar diode, and may also comprise of other integrated circuit designs if desired, such as an amplifier, sensor, or other electrical devices. In the case of a diode, the upper flexible lead 14 may be connected to the anode, and the lower flexible lead 16 may be connected to the cathode of the diode. The assemblies 12 and 13 may be hermetically sealed, or semi-hermetically sealed if desired. The device 10 is scalable in size to fit most any die size. The device 10 is flat and very low profile due to its planar design, further facilitating the device to be directly mounted to a solar panel as desired. A key advantage of the device being very thin is that it can be integrated into the solar panel, either next to the solar cells themselves for rigid panels or attached directly to flexible thin-film solar cells.

Various silicon diode chips may be used in the package, and may be usable for blocking applications and by-pass applications. The device is also suitable for use with the new flex solar cell panels currently deployed in space. The device can be heatsunk directly to the solar panel for solar management. Advantageously, the die junction is protected from sunlight reducing reverse leakage power loss. Large dies may also be used to provide lower Vf since less heat is generated. Schottky dies can also be used for extremely low Vf applications. The device can withstand thermal cycles between −20° C. and +80° C.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A microelectronic device, comprising:
   an integrated circuit having an upper major surface and a lower major surface;
   a first planar flexible lead consisting of essentially a metallic material coupled to the integrated circuit and adapted to route an electrical signal;
   a second planar flexible lead consisting of essentially a metallic material coupled to the integrated circuit and adapted to route an electrical signal;
   a package including a ring encapsulating the integrated circuit, wherein the first planar flexible lead and the second planar flexible lead form an integral portion of the package;
   wherein the first flexible lead freely extends from the package and is coupled to the integrated circuit lower major surface and the second flexible lead freely extends from the package and is coupled to the integrated circuit upper major surface;
   wherein the ring, the first flexible lead and the second flexible lead are configured to provide stress relief to the integrated circuit.

2. The microelectronic device as specified in claim 1 wherein the first planar flexible lead forms a wall of the package.

3. The microelectronic device as specified in claim 1 wherein the metallic material is a copper, gold or silver material.

4. The microelectronic device as specified in claim 1 wherein the first flexible lead and the second flexible lead are configured to be weldable.

5. The microelectronic device as specified in claim 1 wherein the first flexible lead and the second flexible lead are configured to sandwich the integrated circuit.

6. The microelectronic device as specified in claim 1 wherein the integrated circuit is a die.

7. The microelectronic device as specified in claim 1 wherein the integrated circuit is a diode.

8. The microelectronic device as specified in claim 1 wherein the first and second flexible leads have thicknesses no greater than approximately 0.003 inch.

9. The microelectronic device as specified in claim 1 wherein the integrated circuit has a thickness no greater than around approximately 0.014 inch.

10. The microelectronic device as specified in claim 1 wherein the total sandwiched thickness is no greater than around approximately 0.02 inch.

* * * * *